(12) United States Patent
Shih (10) Patent No.: US 6,323,712 B1
(45) Date of Patent: Nov. 27, 2001

(54) DELAY CIRCUIT WITH VOLTAGE COMPENSATION

(75) Inventor: Jeng Tzong Shih, Hsinchu (TW)

(73) Assignee: Etron Technology, Inc., Hsin-Chu (TW)

( * ) Notice: Subject to any disclaimer, the term of this patent is extended or adjusted under 35 U.S.C. 154(b) by 0 days.

(21) Appl. No.: 09/604,066

(22) Filed: Jun. 26, 2000

(51) Int. Cl.⁷ .................................................. H03H 11/26
(52) U.S. Cl. ............................................ 327/276; 327/312
(58) Field of Search ..................................... 327/261–264, 327/268, 276, 277, 284, 285, 309, 310, 312, 321, 333, 378

(56) References Cited

U.S. PATENT DOCUMENTS

| | | | |
|---|---|---|---|
| 5,175,452 | 12/1992 | Lupi et al. ............................ | 307/591 |
| 5,300,837 | 4/1994 | Fischer ................................. | 307/491 |
| 5,315,550 | 5/1994 | Tobita .................................. | 365/194 |
| 5,317,219 | 5/1994 | Lupi et al. ............................ | 307/603 |
| 5,767,719 | * 6/1998 | Furuchi et al. ...................... | 327/281 |
| 5,861,765 | * 1/1999 | Hirai .................................... | 327/261 |
| 6,043,699 | * 3/2000 | Shimizu ............................... | 327/333 |
| 6,147,536 | * 11/2000 | Jeong ................................... | 327/283 |
| 6,150,862 | * 11/2000 | Vikinski .............................. | 327/262 |

* cited by examiner

Primary Examiner—My-Trang Nu Ton
(74) Attorney, Agent, or Firm—George O. Saile; Stephen B. Ackerman; Billy Knowles (57) ABSTRACT

A delay circuit that is insensitive to variations in an input signal voltage level has a voltage clamp at its input terminal to fix the input voltage level so as to remove the sensitivity of the delay circuit to the variations in the input signal voltage level and the power supply voltage source. A voltage independent delay circuit is composed of a first inverter circuit, a voltage clamping circuit, a delay capacitor, and a second inverter circuit. The first inverter circuit has an input terminal and an output terminal. A first output signal at the output terminal is an inverse of an input signal at the input terminal. The voltage clamping circuit is connected between the output terminal and the input terminal of the first inverter circuit to fix a voltage swing of input signal to a first voltage level. The delay capacitor connected to the output terminal of the first inverter to establish a transition time of the first output signal. The second inverter has an input terminal connected to the output terminal of the first inverter circuit and an output terminal. A second output signal at the output terminal of the second inverter is delayed from the input signal and the delay is independent of a final voltage level of the input signal.

31 Claims, 8 Drawing Sheets

FIG. 12 too great, the delay $d_2$ of the second delay circuit may vary so# DELAY CIRCUIT WITH VOLTAGE COMPENSATION

BACKGROUND OF THE INVENTION

1. Field of the Invention

This invention relates to delay circuits within an integrated circuit placed within a signal path to compensate for a delay difference of the signal path with another signal path to appropriately align arrival of signals on the separate signal paths. More particularly, this invention relates to delay circuits that have delays that are generally independent of the voltage level of the signals on the signal path.

2. Description of the Related Art

An integrated circuit is formed of many circuits performing sets of interdependent functions. For instance, in a Dynamic Random Access Memory (DRAM) the address signals arrive at a decode function to select the desired memory cell or cells to be read from or written to. At appropriate timing intervals the control signals, such as Row Address Strobe (RAS), Column Address Strobe (CAS), Chip Enable (CE), and clock, arrive at a control function that will generate the appropriate timing signals necessary to gate the word-line activation signals ($WL_n$) to place a word-line signal on a desired row of an array of memory cells. The row of memory cells is activated, and in a read operation, a charge present within the memory cell flows to an attached bit-line. The voltage level present on the bit-line is determined by the level of charge within the memory cell. To sense the voltage level on a bit-line a sense amplifier must be activated at the correct time to sense the voltage level of the bit-line to determine the state of the data retained in the memory cell. The signals that activate the word-line decoder and the bit-line sense amplifier have a common initiation, but must occur at separate times. The timing for the two paths becomes critical.

One of the factors that influence the relative occurrence of the two signals is the voltage level of each signal. In one instance, the delay for one path, for example, the word-line decode and word-line activation, may be naturally insensitive to the voltage level of the signals traversing the path. However, the delay of the second path, in this case the sense line activation signal, may be dependent upon the voltage level of the signal.

Figure 1:
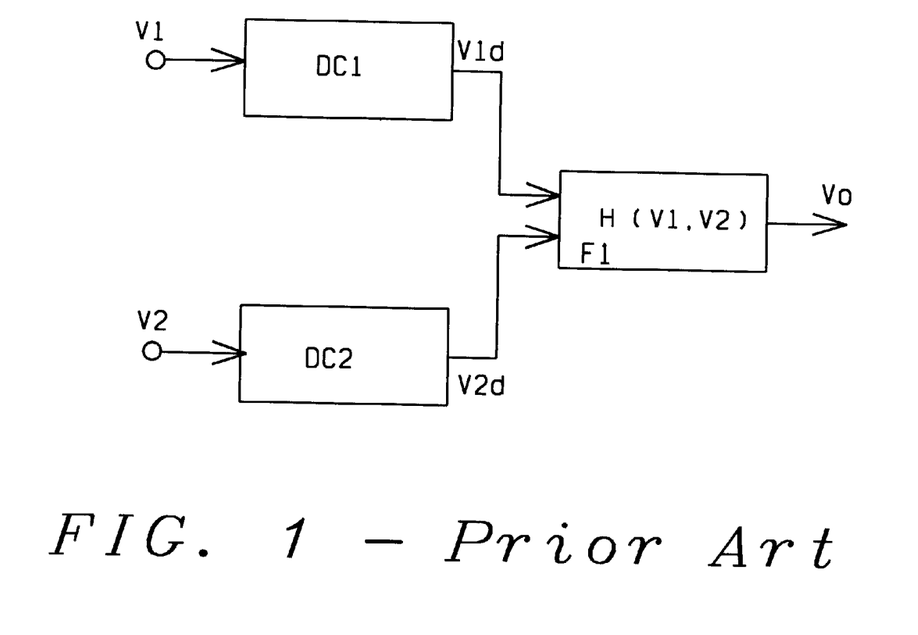
FIG. 1 is a block diagram of signal paths connected to a functional circuit on an integrated circuit.

Refer now to FIG. 1 for a general discussion of the impact of the differences in delay of two signals. In FIG. 1, a first signal $V_1$ traverses a first delay circuit $DC_1$, and a second signal $V_2$ traverses a second delay circuit $DC_2$. The delayed version of the first signal $V_1d$ and the delayed version of the second signal $V_2d$ are combined in the functional block F1 according to the function $V_0=H(V_1, V_2)$. Any variations in the delay of the first delay circuit $DC_1$, or second delay circuit $DC_2$ due to voltage variations (either the power supply voltage level or the voltage levels of the first signal $V_1$ or the second signal $V_2$ affect the results of the output voltage $V_0$ of the functional circuit F1.

Figure 2:
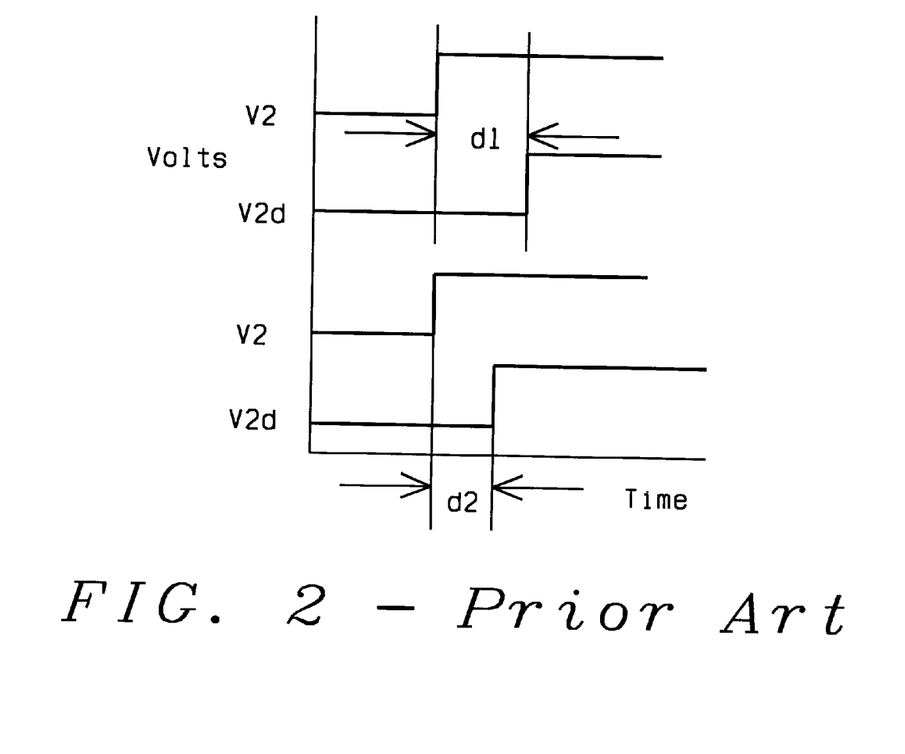
FIG. 2 is a plot of the waveforms showing delays in signals experienced on the signal paths to the functional circuit.

Refer to FIG. 2 for further explanation of this effect. In FIG. 2, the delay of the first delay circuit $DC_1$ is designated d1 and the delay of the second delay circuit $DC_2$ is designated $d_2$. If the first delay is essentially dependent only on such parameters as the line resistance and parasitic capacitances such as for the word-lines and bit-lines of a DRAM memory array, the delay is relatively constant and can be accounted for. However, if the second delay circuit $DC_2$ is an active delay circuit used to compensate in the differences in time between the first signal $V_1$, and the second signal $V_2$, the second delay $d_2$ as explained hereinafter has a dependency on the voltage level of the second signal $V_2$. When the variation in the voltage level of the second signal $V_2$ is too great, the delay $d_2$ of the second delay circuit may vary so as to corrupt the output voltage $V_0$. In the example of a DRAM, the second delay circuit is an active delay circuit used to delay the sense amplifier activation signal until the voltage level on the bit-lines is set to indicate the level of charge present on the memory cell. If the voltage level of the original sense amplifier activation signal varies, then the magnitude of the delay time $d_2$ varies and the sense amplifier may sense the incorrect data.

Figure 3A:
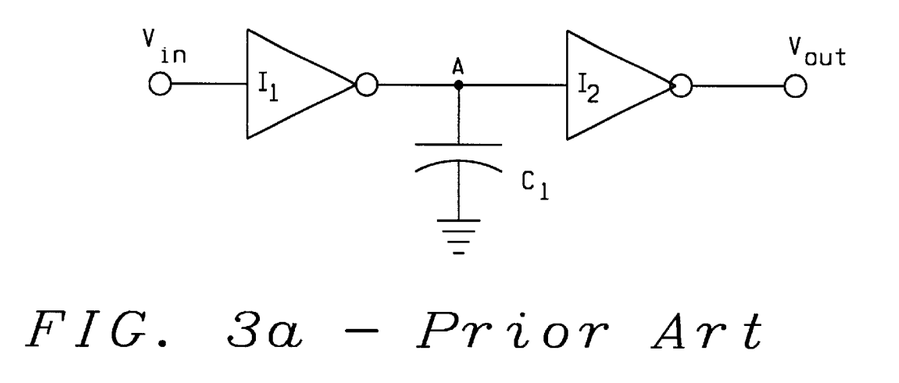
FIG. 3a is a schematic diagram of a delay circuit of the prior art.

Refer now to FIG. 3 for a description of an active delay circuit. The basic active delay circuit consists of two inverters connected serially with the output of the first inverter $I_1$ connected to the input of the second inverter $I_2$. The capacitor $C_1$ is connected to the junction of the output of the first inverter $I_1$ and the input of the second inverter $I_2$. The input of the first inverter $I_1$, receives the input signal $V_{IN}$. The output A of the first inverter $I_1$ provides a voltage signal that is the inverse of the input signal $V_{IN}$ The transition time of the output A of the first inverter $I_1$, is determined by the value of the capacitor $C_1$.

The voltage level of the output $V_0$ at the second inverter $I_2$ is the inverse of the voltage level at the input of the second inverter $I_2$. The threshold at which the output $V_{OUT}$ of the second inverter transitions between voltage levels is thus delayed by the change in transition time determined by the value of the capacitor $C_1$.

Figure 3B:
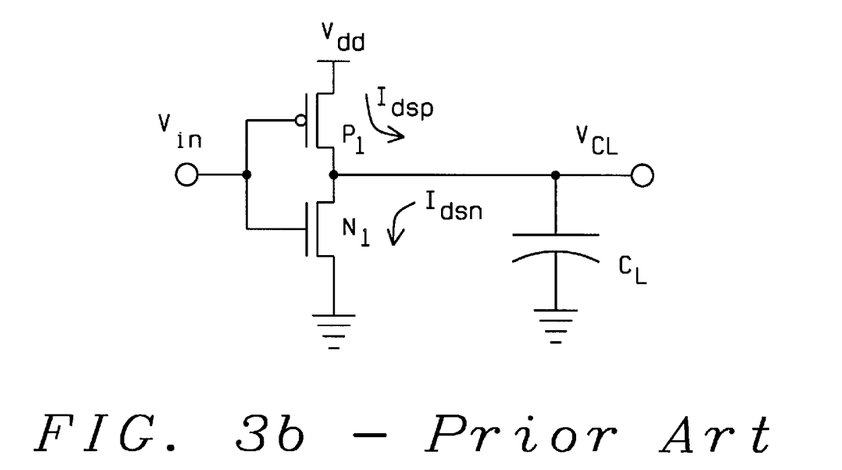
FIG. 3b is a schematic diagram of an inverter of the delay circuit of the prior art.

The inverters $I_1$ and $I_2$ of FIG. 3a are generally structured as shown in FIG. 3b. The input terminal of the inverter is connected to the gates of the p-type metal oxide semiconductor (MOS) transistor $P_1$ and n-type (MOS) transistor $N_1$. The source of the p-type MOS transistor $P_1$ is connected to the power supply voltage source $V_{DD}$, and the source of the n-type MOS transistor $N_1$ is connected to the ground reference point. The drains of the p-type MOS transistor $P_1$ and the n-type MOS transistor $N_1$ are connected together to form the output terminal of the inverter. The output terminal is connected to a load capacitor $C_L$ that simulates the wiring capacitances and input capacitances of subsequent circuits.

The output voltage $V_{CL}$ at the output terminal during a transition from a low voltage level to a high voltage level is determined by the formula:

$$V_{CL} = \frac{Q}{C_L} = \frac{t * I_{DSP}}{C_L}$$

where:
 Q is the charge present on the load capacitor.
 $C_L$ is the value of the load capacitor.
 t is the time of the transition of the output signal.
 $I_{DSP}$ is the drain-to-source saturation current of the p-type MOS transistor $P_1$ and is proportional to the square of the input voltage $V_{IN}$. That is:

$$I_{DSN}=(V_{DD}-V_{IN(L)})^2.$$

Likewise, the voltage $V_{CL}$ at the output terminal during a transition from a high voltage level to a low voltage level is determined by the formula:

$$V_{CL} = \frac{Q}{C_L} = \frac{t * I_{DSN}}{C_L}$$

where:
 $I_{DSN}$ is the drain-to-source saturation current of the n-type MOS transistor $N_1$ and is also proportional to the square of the input voltage $V_{IN}$. That is:

$$I_{DSN}=V_{IN(L)}^2=V_{DD}^2$$
because $V_{in}=V_{DD}$ when $V_{in}$ high.

Figure 4:
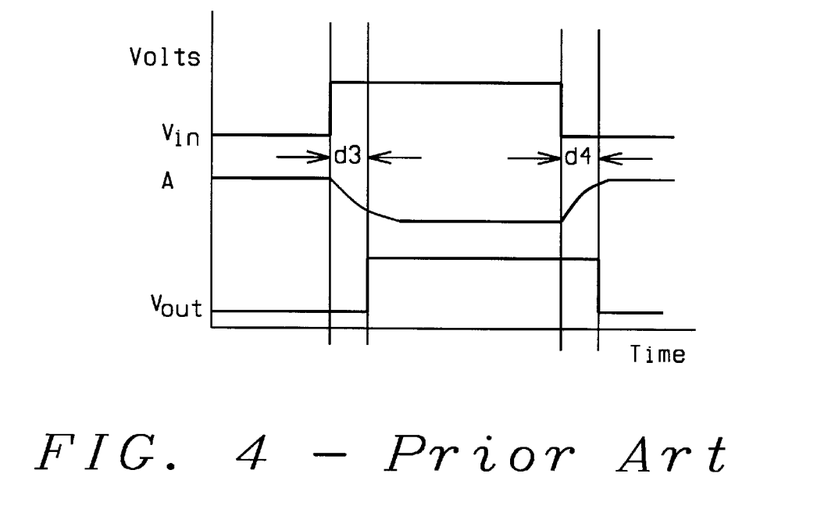

FIG. 4 illustrates the plots of the waveforms at the input terminal $V_{IN}$ of the first inverter $I_1$, the output A of the first inverter $I_1$ and the output $V_{OUT}$ of the second inverter $I_2$. As described above, the output A of the first inverter $I_1$ has a transition from a high voltage level to a low voltage level that is proportional to the drain-to-source saturation current of the n-type MOS transistor $N_1$ and thus proportional to the square of the input voltage level $V_{IN}$. A variation in the voltage level of the input voltage $V_{IN}$ causes a variation in the delay $d_3$ between the transition of the input voltage level $V_{IN}$ and the output voltage level $V_{OUT}$.

Likewise, the output A of the first inverter $I_1$ has a transition from a low voltage level to a high voltage level that is proportional to the drain-to-source saturation current of the p-type MOS transistor $P_1$ and thus proportional to the square of the difference between the power supply voltage source $V_{DD}$ and the input voltage level $V_{IN}$. Also, as stated above, any variation in the voltage level of the input voltage level $V_{IN}$ causes a variation in the delay between the transition of the input voltage level $V_{IN}$ and the output voltage level $V_{OUT}$.

As described in FIG. 1, any variation in the delays $d_3$ and $d_4$ will affect the output signal of the functional circuit $F_1$ and thus may cause error conditions. In a DRAM this error, condition may be a misreading of the data transferred from a memory cell.

U.S. Pat. No. 5,317,219 and U.S. Pat. No. 5,175,452 (Lupi, et al.) each describe a programmable compensated digital delay circuit. A signal-to-be-delayed is provided to a group of time delay cells which, are selectively capable of being interconnected, thus forming one or more delay configurations. In each delay cell, selectable capacitive elements are arrayed in a weighted manner and a memory programmably selects the capacitive elements by switching differently rated capacitive elements into and out of the circuit. Selectable current sources are arrayed in a weighted manner, and another memory programmably selects the current sources by switching differently rated current sources into and out of the circuit. The delay circuit includes internal compensation and uses a ring oscillator for temperature and power supply compensation. A pulse-width distortion compensation device is provided to compensate the delay line for switching non-linearities. The pulse-width compensation portion of the device serially connects an even number of complementary delay elements to cancel transfer function deviations.

U.S. Pat. No. 5,300,837 (Fischer) teaches a delay compensation technique for buffers. An integrated circuit has a signal path including a first circuit that introduces a propagation delay that decreases with circuit conditions and process speed in series with a second circuit that introduces a propagation delay that increases with circuit conditions and process speed. The circuit conditions and process speed are sensed and the duration of the propagation delay of the second circuit varied such that the total propagation delay remains within a predetermined range over circuit condition and process speed variations.

U.S. Pat. No. 5,315,550 (Tobita) describes a dynamic random access memory having sense amplifier activation delayed based on operation supply voltage. The dynamic random access memory operates with different power supply voltages and provides sufficient operating margin for each rated voltage. The dynamic random access memory comprises a circuit for generating a signal for defining operation speed/timing of a sense amplifier depending on the operation supply voltage, and a circuit for driving the sense amplifier in response to an output of a defining signal generating circuit.

SUMMARY OF THE INVENTION

An object of this invention is to provide a delay circuit that is insensitive to variations in a power supply voltage level.

Another object of this invention is to provide a delay circuit having a voltage clamp at its input terminal to fix the input voltage level so as to remove the sensitivity of the delay circuit to variations in the power supply voltage level.

Further, another object of this invention is to provide an integrated circuit having multiple functional circuits connected by signal paths to other functional circuits where the delay of one signal path is generally insensitive to the voltage level of the signal on that path and a second path contains a delay circuit that is also insensitive to the voltage level of the signal of the second path.

To accomplish these and other objects a voltage independent delay circuit is composed of a first inverter circuit, a voltage clamping circuit, a delay capacitor, and a second inverter circuit. The first inverter circuit has an input terminal and an output terminal. A first output signal at the output terminal is an inverse of an input signal at the input terminal. The voltage clamping circuit is connected between the output terminal and the input terminal of the first inverter circuit to fix a voltage swing of input signal to a first voltage level. The delay capacitor connected to the output terminal of the first inverter to establish a transition time of the first output signal. The second inverter has an input terminal connected to the output terminal of the first inverter circuit and an output terminal. A second output signal at the output terminal of the second inverter is delayed from the input signal and the delay is independent of a final voltage level of the input signal and the power supply voltage source level.

To provide a delay that is independent of the final voltage for an transition of the input signal from a first voltage level to a second voltage level, the voltage clamping circuit is composed of diode connected first and second MOS transistors of a first conductivity type and a gating third MOS transistor of the first conductivity type. The gate and drain of the first MOS transistor of the first conductivity type are connected to the output terminal of the first inverter. The source of the first MOS transistor is connected to the gate and drain of the second MOS transistor of the first conductivity type The drain of the third MOS transistor of the first conductivity type is connected to a source of the second MOS transistor of the first conductivity type. The third MOS transistor of the second conductivity type has a gate connected to the output terminal of the first inverter, and a source connected to a reference voltage terminal.

The voltage clamping circuit may optionally contain a diode connected first MOS transistor of a second conductivity type. The first MOS transistor of the second conductivity typed has a gate and drain connected together connected to the connection of the source of the second MOS transistor of the first conductivity type and the drain of the third MOS transistor of the first conductivity type, and a source connected to the output terminal of the first inverter. The first MOS transistor of the second conductivity type provides compensation for a MOS transistor of the second conductivity type connected to the output terminal of a circuit providing the input signal.

To provide a delay that is independent of the final voltage for a transition of the input signal from the second voltage level to the first voltage level, the voltage clamping circuit is composed of diode connected second and third MOS transistors the second conductivity type and a gating fourth MOS transistor of the second conductivity type. The second MOS transistor of the second conductivity type has a gate and drain connected together and to the input terminal of the first inverter. The third MOS transistor of the second conductivity type has a gate and drain connected together and connected to a source of the second MOS transistor of the second conductivity type. The fourth MOS transistor of the second conductivity type has a drain connected to a source of the third MOS transistor of the second conductivity type, a gate connected to the output terminal of the first inverter, and a source connected to a power supply voltage terminal.

The voltage clamping circuit may optionally have a diode connected fourth MOS transistor of the first conductivity type. The fourth MOS transistor of the first conductivity type has a gate and drain connected together and connected to the connection of the source of the third MOS transistor of the second conductivity type and the drain of the fourth MOS transistor of the second conductivity type, and a source connected to the output terminal of the first inverter.

A second embodiment of the voltage clamping circuit is composed of diode connected fifth and sixth MOS transistors of the second conductivity type, and a gating fifth MOS transistor of the first conductivity type. The fifth MOS transistor of the second conductivity type has a gate and drain connected together, and a source connected to the input terminal of the first inverter. The sixth MOS transistor of the second conductivity type having a gate and drain connected together, and a source is connected to the gate and drain of the fifth MOS transistor of the second conductivity type. The gating fifth MOS transistor of a first conductivity type has a drain connected to the gate and drain of the sixth MOS transistor of the second conductivity type, a gate is connected to the output terminal of the first inverter, and a source connected to a reference voltage terminal.

The second embodiment of the voltage clamping circuit is optionally composed of a diode connected sixth and seventh MOS transistor of the first conductivity type, and a gating seventh MOS transistor of the second conductivity type. The sixth MOS transistor of the first conductivity type has a gate and drain connected together, and a source connected to the input terminal of the first inverter. The seventh MOS transistor of the first conductivity type has a gate and drain connected together, and a source connected to gate and drain of the sixth MOS transistor of the first conductivity type. The seventh MOS transistor of the second conductivity type has a drain connected to gate and drain of the seventh MOS transistor of the first conductivity type, a gate connected to the output terminal of the first inverter, and a source connected to a power supply voltage terminal.

An alternate embodiment of the voltage independent delay circuit is to delay a first transition of a primary input signal while not delaying a second transition of the primary input signal. To accomplish this the voltage independent delay circuit additionally has a third and fourth inverter and the second inverter is replaced with a logic gate. A first input of the logic gate is connected to the output of the first inverter. The third inverter has an input connected to receive the primary input signal and an output terminal connected to a second input terminal of the logic gate. The second transition of the primary input signal causes the output signal to transition with minimum delay, while the first transition of the primary input signal is delayed in time to form the delayed transition of the output signal. The third inverter has an input terminal connected to the output terminal of the second inverter and an output terminal connected to the input terminal of the first inverter whereby the first input signal is an inverse of an output of the second inverter.

BRIEF DESCRIPTION OF THE DRAWINGS

FIG. 4 is a plot of the waveforms of the signals in the delay circuit of FIG. 3a.

A fourth embodiment of the delay circuit of this invention is illustrated in

DETAILED DESCRIPTION OF THE INVENTION

Figure 5:
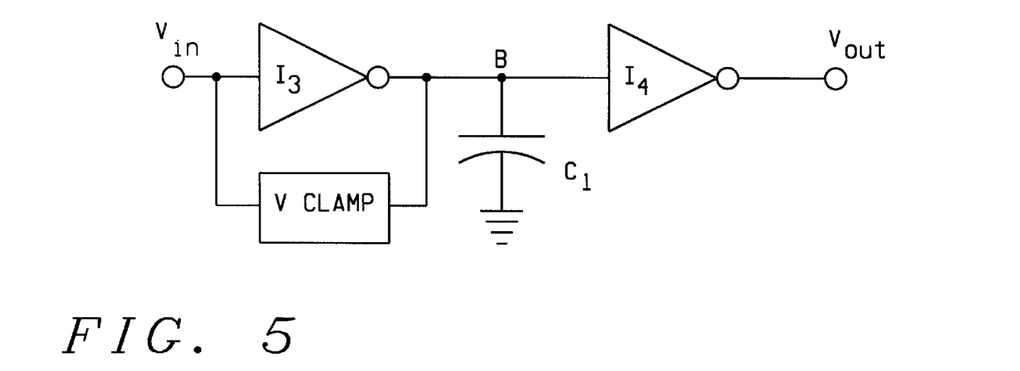
FIG. 5 is a schematic diagram of a voltage independent delay circuit of this invention.

Refer now to FIG. 5 to discuss the function and structure of a voltage independent delay circuit of this invention. The inverters $I_3$ and $I_4$ are serially connected output to input with the output of inverter $I_3$ being connected to the input of inverter $I_4$. The inverter $I_3$ receives and inverts the input signal $V_{IN}$ to form the signal at the interconnection B. The signal at the interconnection B is then received and inverted by the inverter $I_4$ to form the output signal $V_{OUT}$.

The capacitor $C_1$ is placed between the interconnection B and the ground reference point and causes the transition of the signal present at the interconnection B to decrease or slow similarly to that described in FIG. 1. The voltage clamping circuit is placed between the output and the input of the first inverter $I_3$. The voltage clamping circuit fixes or clamps the voltage level of the input signal $V_{IN}$ to a fixed level and prevents the maximum amplitude that is possible for the input signal $V_{IN}$ from being present at the input of the inverter $I_3$.

When the output signal of the first inverter $I_3$ has traversed the threshold voltage of the second inverter $I_4$, thus causing the output voltage $V_{OUT}$ to transition from one voltage level to a second voltage level, the voltage clamping circuit is disabled, preventing any power dissipation when the input signal $V_{IN}$ is at a steady state.

Figure 6:
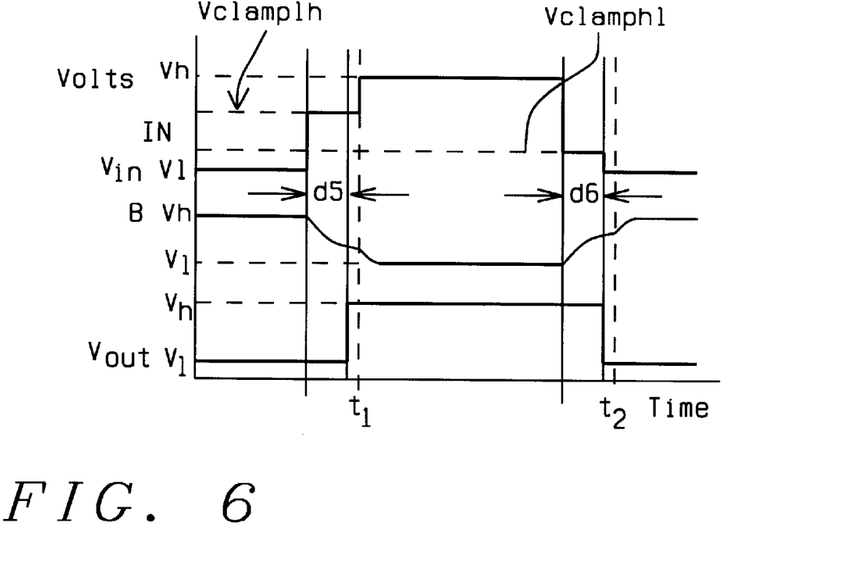
FIG. 6 is a plot of the waveforms of the signals in the delay circuit of FIG. 5.

For a more detailed view of the operation of the voltage clamping circuit, refer now to FIG. 6. As the input signal level $V_{IN}$ rises from a low voltage level $V_L$ to a high voltage level $V_H$, the voltage clamping circuit activates and fixes or clamps the input voltage $V_{IN}$ to the first clamp voltage level $V_{clampLH}$. The output voltage level $V_B$ of the inverter $I_3$ begins to transition from the high voltage level $V_H$ to the low voltage level $V_L$. As described in FIG. 3, the slope of the transition, and thus the delay $d_5$, is determined by the value of the capacitor $C_1$ and the magnitude of the drain-to-source saturation current $I_{DSN}$ of the n-type MOS transistor $N_1$. As explained, the drain-to-source saturation current $I_{DSN}$ is proportional to the square of the input voltage level $V_{IN}$ which is equal to the power supply voltage source $V_{DD}$. Clamping or fixing the voltage level of the input signal $V_{IN}$ prevents any variations in the voltage level $V_H$ from previous stages or the power supply voltage source $V_{DD}$ from having an impact on the magnitude of the delay $d_5$ of the delay circuit.

At the time $t_1$, which is subsequent to the transition of the voltage level $V_B$ at the interconnection B exceeding the threshold level of the voltage clamping circuit, the voltage clamping circuit is disabled. Disabling the voltage clamping circuit prevents dissipation of power in the voltage clamping circuit when the input signal $V_{IN}$ has achieved the high voltage level $V_H$.

When the input signal $V_{IN}$ falls from the high voltage level $V_H$ to the low voltage level $V_L$, the voltage clamping circuit now activates and fixes or clamps the input voltage level $V_{IN}$ to a second clamp voltage level $V_{CLAMP\ HL}$. The output voltage level $V_B$ of the inverter $I_3$ begins to transition from the low voltage level $V_L$ to the high voltage level $V_H$. Again, as described in FIG. 3, the slope of the transition, and thus the delay $d_6$, is determined by the value of the capacitor $C_1$ and the magnitude of the drain-to-source saturation current $I_{DSP}$ of the p-type MOS transistor $P_1$. As explained, the drain-to-source saturation current $I_{DSP}$ is proportional to the square of the difference between the power supply voltage source $V_{DD}$ and the input voltage level $V_{IN}$. Clamping or fixing the voltage level of the input signal $V_{IN}$ prevents any variations in the voltage level $V_H$ from previous stages or the power supply voltage source $V_{DD}$ level from causing an impact on the magnitude of the delay $d_6$ of the delay circuit.

At the time $t_2$, which is subsequent to the transition of the voltage level $V_B$ at the interconnection B exceeding the threshold level of the inverter $I_4$, the voltage clamping circuit is disabled. Disabling the voltage clamping circuit prevents dissipation of power in the voltage clamping circuit when the input signal $V_{IN}$ has achieved the low voltage level $V_L$.

Figure 7:
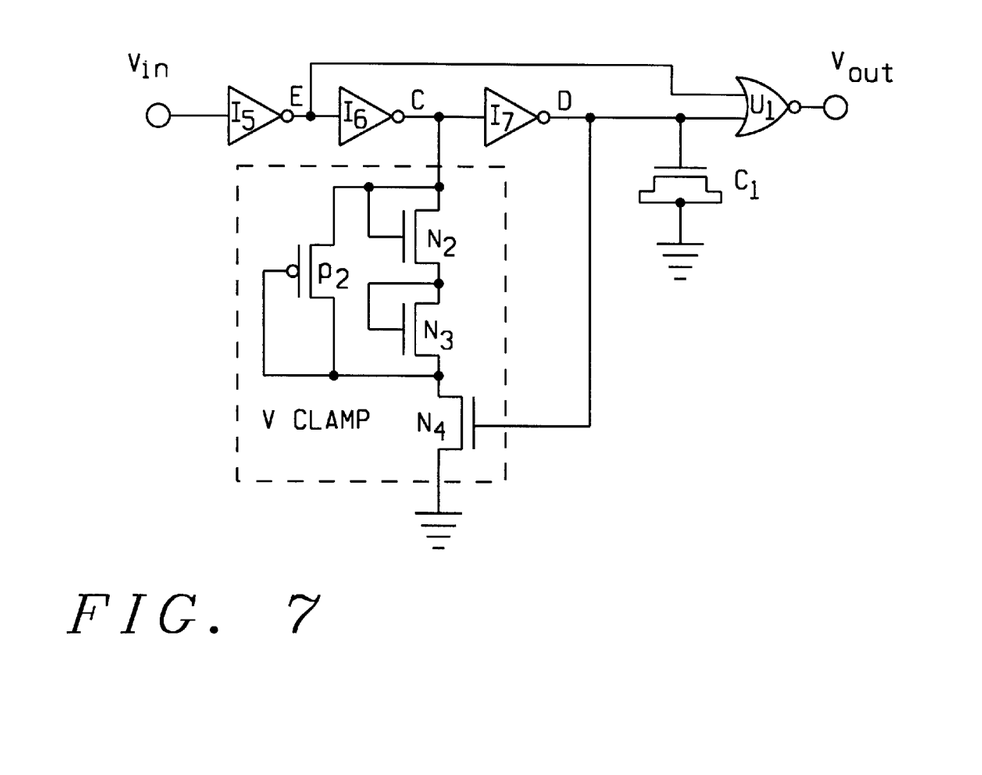
FIG. 7 is a schematic diagram of a first embodiment of a voltage independent delay circuit of this invention.

In certain applications, the delay of the output signal $V_{OUT}$ from the input signal $V_{IN}$ is necessary for only one transition of the signal. The second transition of the output signal $V_{OUT}$ is required to occur with minimal delay from the input signal $V_{IN}$. FIG. 7 illustrates a first embodiment of this invention where the transition of the output signal $V_{OUT}$ from a low voltage level $V_L$ to a high voltage level $V_H$ is delayed from the transition of the input signal $V_{IN}$. The delay circuit has the inverters $I_5$, $I_6$, and $I_7$ connected serially output to input. The input of the inverter $I_5$ is connected to receive the input voltage signal $V_{IN}$. The output of the inverter $I_5$ is connected to the input of the inverter $I_6$ to form the interconnection E. The output of the inverter $I_7$ is connected to the input of the inverter $I_7$ to form the interconnection C. The output of the inverter $I_7$ is connected to the first input of the logic gate $U_1$ to form the interconnection D.

The inverters $I_5$ and $I_6$ act as buffer circuits for the input voltage signal $V_{IN}$. The inverter $I_7$ and the logic gate perform the functions of the inverters $I_3$ and $I_4$ of FIG. 5 described above. The capacitor $C_1$ is formed from the gate-to-bulk capacitance of an n-type MOS transistor. The source and drain terminals of the n-type MOS transistor are connected to the bulk to add the gate-to-source and the gate-to-drain capacitances to the gate-to-bulk capacitance to form the capacitor $C_1$.

Figure 9:
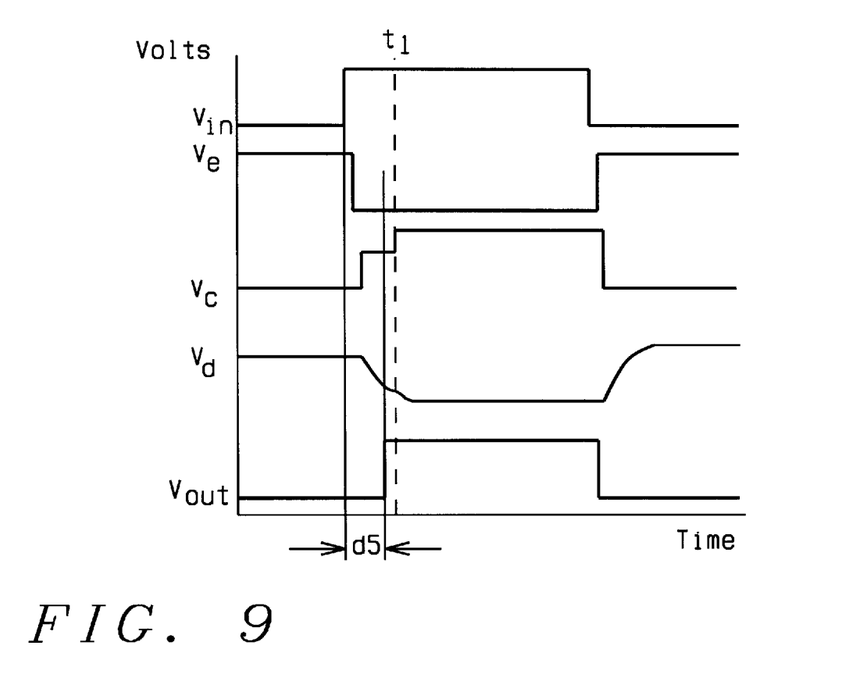
FIG. 9 is a plot of the voltage waveforms of the signals within the first embodiment of a voltage independent delay circuit of FIG. 7.

The voltage clamping circuit is connected between the interconnection D at the output of the inverter $I_7$ and the interconnection C at the input of the inverter $I_7$. Refer to FIG. 9 during the discussion of the operation of the delay circuit of FIG. 7 to understand the voltage and timing of the operation of the delay circuit of FIG. 7. The voltage clamp fixes or clamps the voltage $V_C$ at the interconnection C, as described above in FIG. 5, for a transition of the voltage level from a low level to a high level.

The voltage clamping circuit is formed of the diode connected n-type MOS transistors $N_2$ and $N_3$, the gating n-type MOS transistor $N_4$, and the optionally diode connected p-type MOS transistor $P_2$. The gate and drain of the n-type MOS transistor $N_2$ and the source of the p-type MOS transistor $P_2$ are connected to the interconnection C. The gate and drain of the n-type MOS transistor $N_3$ are connected to the source of the n-type MOS transistor N2. The gate and drain of the p-type MOS transistor $P_2$ and the source of the n-type MOS transistor $N_3$ are connected to the drain of the gating n-type MOS transistor $N_4$.

As is known in the art, the gate-to-source voltage of the diode connected n-type MOS transistors $N_2$ and $N_3$ and the p-type MOS transistor $P_2$ is a function of the device dimensions and the current through the diode connected n-type MOS transistors $N_2$ and $N_3$ and the p-type MOS transistor $P_2$. Thus, the clamping voltage at the interconnection C is set by the design of the device dimensions of the diode connected n-type MOS transistors $N_3$ and $N_4$ and the diode connected p-type MOS transistor $P_2$.

As the input voltage level $V_C$ at the input of the inverter $I_7$ transitions from the low voltage level $V_L$ to the clamping voltage level, the output voltage level $V_D$ at the interconnection D decreases in manner, as described in FIG. 3a, discharging the capacitor $C_1$. Once the voltage level at the interconnection D reaches the threshold voltage $V_T$ of the n-type MOS transistor $N_4$, the n-type MOS transistor $N_4$ turns off and the voltage level at the interconnection C continues to rise to the maximum high voltage level $V_H$.

The second input of the logic gate $U_1$ is connected to the output of the inverter $I_5$ at the interconnection E. As the voltage level of the input voltage signal $V_{IN}$ rises from the low voltage level $V_L$ to the high voltage level $V_H$, the voltage level $V_E$ at the interconnection E falls from the high voltage level $V_H$ to the low voltage level $V_L$. In the preferred embodiment, the logic gate $U_1$ is a logical NOR, thus making the output voltage level $V_{OUT}$ dependent on the first input connected interconnection D when the voltage level $V_E$ of the second input is at the low voltage level $V_L$. This allows the delay of the delay circuit to be applied to the transition of the output voltage signal $V_{OUT}$ from a low voltage level $V_L$ to a high voltage level $V_H$ to be delayed from the transition of the input voltage level $V_{IN}$. However, when the transition of the input voltage signal $V_{IN}$ traverses from the high voltage level $V_H$ to the low voltage level $V_L$, the voltage level $V_E$ at the interconnection E traverses from the low voltage level $V_L$ to the high voltage level $V_H$, causing the output voltage signal $V_{OUT}$ to traverse from the high voltage level $V_H$ to the low voltage level $V_L$ with minimum delay. This delay is independent of the delay circuit described above.

The optional diode connected p-type MOS transistor $P_2$ is incorporated in the clamping circuit to provide for variation in the semiconductor process during construction of the p-type MOS transistor $P_1$ of FIG. 3b in the inverter $I_6$. A second embodiment to also compensate for the variations of the p-type MOS transistor $P_1$ in the inverter $I_6$ is shown in FIG. 8.

Figure 8:
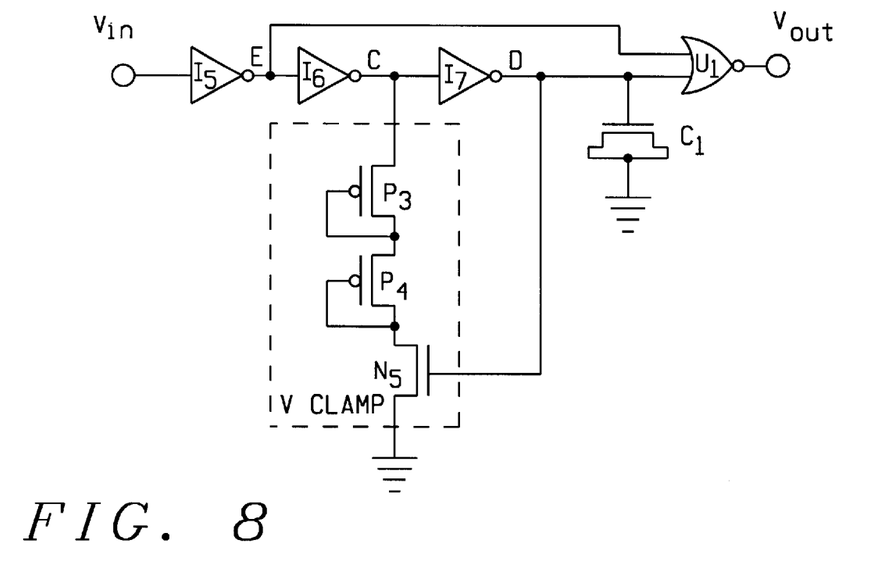
FIG. 8 is a schematic diagram of a second embodiment of a voltage independent delay circuit of this invention.

The structure and function of the delay circuit of FIG. 8 except the voltage clamping circuit now consists of the diode connected p-type MOS transistors $P_3$ and $P_4$ and the gating n-type MOS transistor $N_5$. The source of the diode connected p-type MOS transistor $P_3$ is connected to the interconnection C. The gate and drain of the diode connected p-type MOS transistor $P_3$ are connected to the source of the p-type MOS transistor $P_4$. The gate and drain of the p-type MOS transistor $P_4$ are connected to the drain of the gating n-type MOS transistor $N_5$. The gate of the gating n-type MOS transistor $N_5$ is connected to the output of the inverter $I_7$ and the source of the gating n-type MOS transistor $N_6$ is connected to the ground reference point.

As described above, the gate-to-source voltage $V_{gs}$ of the diode connected p-type MOS transistors $P_3$ and $P_4$ is a function of the physical dimensions (W/L) and the current through them. Thus, the clamping voltage level at the interconnection C is determined by the structure of the diode connected p-type MOS transistors $P_3$ and $P_4$.

The voltage clamping circuit operates similar to that described in FIG. 7. If the voltage level of the input voltage signal $V_{IN}$ is at the low voltage level $V_L$, the voltage level $V_D$ of the interconnection D is at the high voltage level $V_H$, thus turning on the gating n-type MOS transistor $N_5$. As the voltage level of the input voltage signal $V_{IN}$ rises, the voltage level $V_C$ at the interconnection C rises until it reaches the clamping voltage level. This level is greater than the threshold voltage level of the inverter $I_7$, but less than the high voltage level VH. This forces the transition time of the voltage at the interconnection D to remain essentially constant and independent of the voltage level of the input voltage signal $V_{IN}$. When the voltage level $V_D$ has fallen below the threshold voltage $V_T$ of the n-type MOS transistor $N_5$, the n-type MOS transistor $N_5$ turns off and the voltage clamping circuit is disabled to prevent dissipation of power in the voltage clamping circuit when the voltage level of the input voltage signal $V_{IN}$ is at a steady state.

Figure 10:
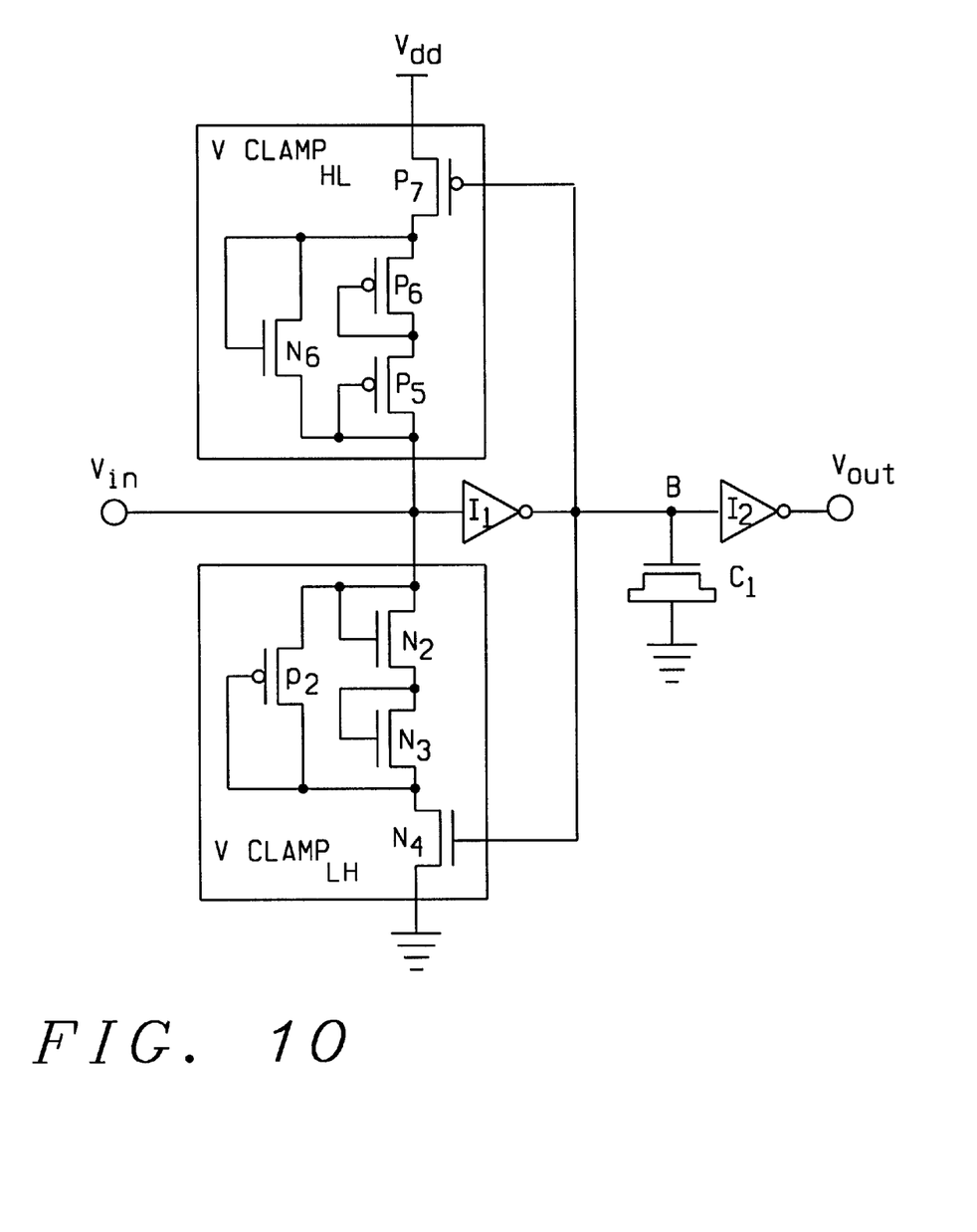
FIG. 10 is a schematic diagram of a third embodiment of a voltage independent delay circuit of this invention.

A third embodiment of the delay circuit of this invention is illustrated in FIG. 10. This embodiment illustrates the structure of the general description of FIG. 5. The low-to-high voltage clamping circuit $V_{CLAMP\ LH}$ provides the necessary delay $d_5$ of FIG. 6 for a transition of the input voltage signal $V_{IN}$ from the low voltage level $V_L$ to the high voltage level $V_H$, whereas the high-to-low voltage clamping circuit $V_{CLAMP\ HL}$ provides the delay $d_6$ of FIG. 6 for a transition of the input voltage signal $V_{IN}$ from the high voltage level $V_H$ to the low voltage level $V_L$.

The input of the inverter $I_1$ is connected to receive the input voltage signal $V_{IN}$.

The output of the inverter $I_1$ is connected to the input of the inverter $I_2$ to form the interconnection B. The output of the inverter $I_2$ transfers the output voltage signal $V_{OUT}$ to subsequent circuitry. The capacitor $C_1$ is structured and connected as shown in FIG. 5. The low-to-high voltage clamping circuit is constructed and functions as the clamping circuit of FIG. 7.

The high-to-low voltage clamping circuit is formed of the diode connected p-type MOS transistors $P_5$ and $P_6$, the gating p-type MOS transistor $P_7$ and the optional diode connected n-type MOS transistor $N_6$. The gate and drain of the diode connected p-type MOS transistor $P_5$ is connected to the input of the inverter $I_1$. The gate and drain of the diode connected p-type MOS transistor $P_6$ is connected to the source of the p-type MOS transistor $P_5$. The source of the p-type MOS transistor $P_6$ is connected to the drain of the gating p-type MOS transistor $P_7$. The source of the gating p-type MOS transistor $P_7$ is connected to the power supply voltage source. The gate of the p-type MOS transistor $P_7$ is connected to the output of the inverter $I_1$.

The gate and drain of the diode connected n-type MOS transistor $N_6$ are connected to the drain of the gating p-type MOS transistor $P_7$. The source of the diode connected n-type MOS transistor $N_6$ is connected to the input of the inverter $I_1$. The diode connected n-type MOS transistor $N_6$ is used to compensate for variations in process of the n-type MOS transistor $N_1$ of a circuit generating the input voltage signal $V_{IN}$. The circuit generating the input voltage signal $V_{IN}$ is structured similar to that shown in FIG. 3b.

Refer to FIG. 6. When the voltage level of the input voltage signal $V_{IN}$ is at the high voltage level $V_H$, the voltage level at the interconnection B is at the low voltage level $VL_7$ thus turning on the gating p-type MOS transistor $P_7$. As the voltage signal of input voltage signal $V_{IN}$ traverses from the high voltage level $V_H$ to the low voltage level $V_L$, the voltage level $V_B$ at the interconnection B begins to rise as the capacitor $C_1$ charges.

The voltage level of the input voltage signal $V_{IN}$ only achieves the voltage level $V_{CLAMP\ HL}$. This voltage level is fixed and sets the drain-to-source saturation current $I_{DSP}$ of the p-type MOS transistor $P_1$ of the inverter $I_1$ to maintain the delay time $d_6$ independent of the voltage level of the input voltage signal $V_{IN}$.

When the voltage level $V_B$ of the interconnection B exceeds the threshold voltage $V_T$ of the gating p-type MOS transistor $P_7$ the p-type MOS transistor $P_7$ is turned off and the voltage level of the input voltage signal $V_{IN}$ achieves the high voltage level $V_H$.

When the gating p-type MOS transistor $P_7$ is turned off, the high-to-low voltage clamping circuit is deactivated to prevent dissipation of power during the period of time that the voltage level of the input voltage signal $V_{IN}$ is at the low voltage level $V_L$.

Figure 12:
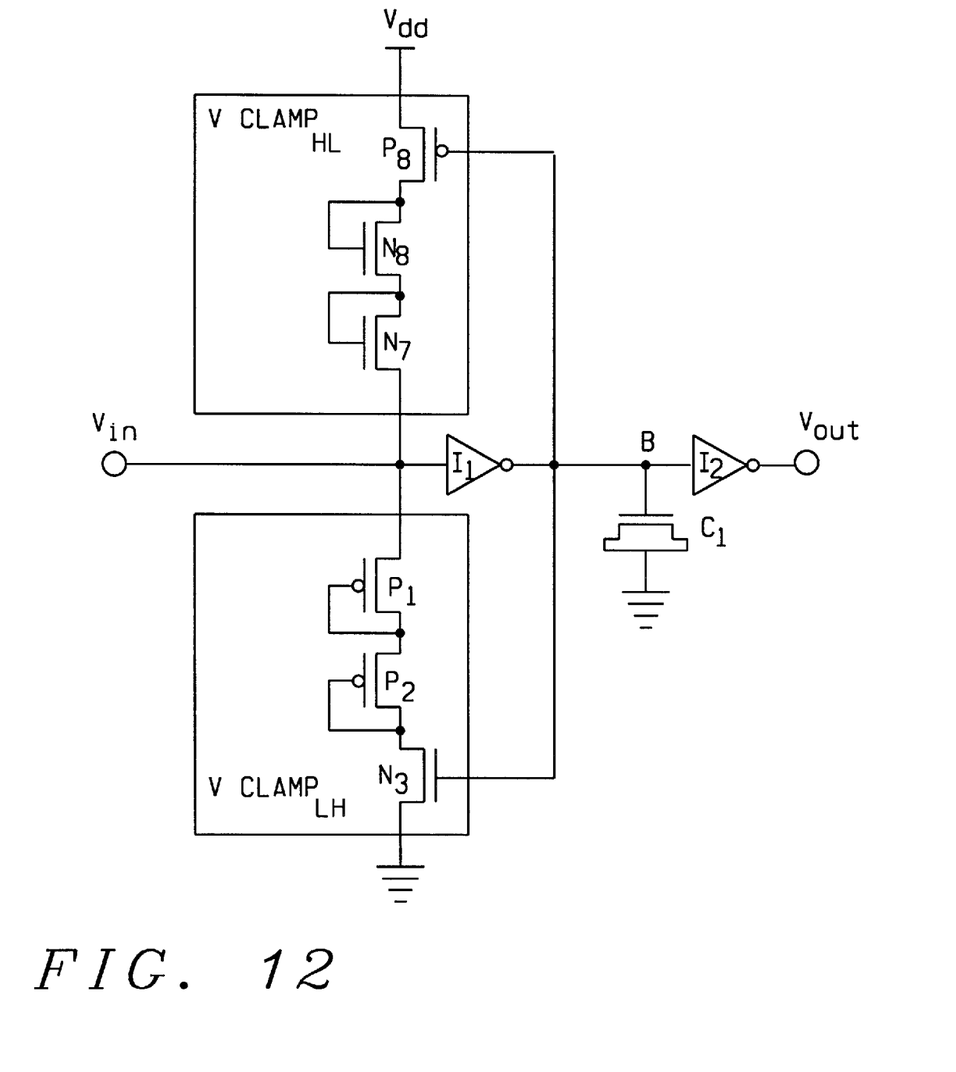
FIG. 12 is a schematic diagram of a fourth embodiment of a voltage independent delay circuit of this invention.

A fourth embodiment of the delay circuit is delay circuit of this invention is illustrated in FIG. 12. This embodiment illustrates a second version of the structure of the general description of FIG. 5 and function as described above. The low-to-high voltage clamping circuit is constructed and functions as the clamping circuit of FIG. 8.

The high-to-low voltage clamping circuit is formed of the diode connected n-type MOS transistors $N_7$ and $N_8$ and the gating p-type MOS transistor $P_8$. The source of the diode connected n-type MOS transistor $N_7$ is connected to the input of the inverter 11. The gate and drain of the diode connected n-type MOS transistor $N_7$ is connected to the source of the n-type MOS transistor $N_8$. The gate and drain of the p-type MOS transistor $P_6$ are connected to the drain of the gating p-type MOS transistor $P_8$. The source of the gating p-type MOS transistor $P_8$ is connected to the power supply voltage source. The gate of the p-type MOS transistor $P_8$ is connected to the output of the inverter $I_1$.

Refer to FIG. 6. When the voltage level of the input voltage signal $V_{IN}$ is at the high voltage level $V_H$, the voltage level at the interconnection B is at the low voltage level $V_L$, thus turning on the gating p-type MOS transistor $P_8$. As the voltage signal of input voltage signal VIN traverses from the high voltage level $V_H$ to the low voltage level $V_L$, the voltage level $V_B$ at the interconnection B begins to rise as the capacitor $C_1$, charges.

The voltage level of the input voltage signal $V_{IN}$ only achieves the voltage level $V_{CLAMP\_HL}$. This voltage level is fixed and sets the drain-to-source saturation current $I_{DSP}$ of the p-type MOS transistor $P_1$ of the inverter $I_1$ to maintain the delay time $d_6$ independent of the voltage level of the input voltage signal $V_{IN}$.

When the voltage level $V_B$ of the interconnection B exceeds the threshold voltage $V_T$ of the gating p-type MOS transistor $P_8$, the p-type MOS transistor $P_8$ is turned off and the voltage level of the input voltage signal $V_{IN}$ achieves the high voltage level $V_H$.

When the gating p-type MOS transistor $P_7$ is turned off, the high-to-low voltage clamping circuit is deactivated to prevent dissipation of power during the period of time that the voltage level of the input voltage signal $V_{IN}$ is at the low voltage level $V_L$.

Figure 11:
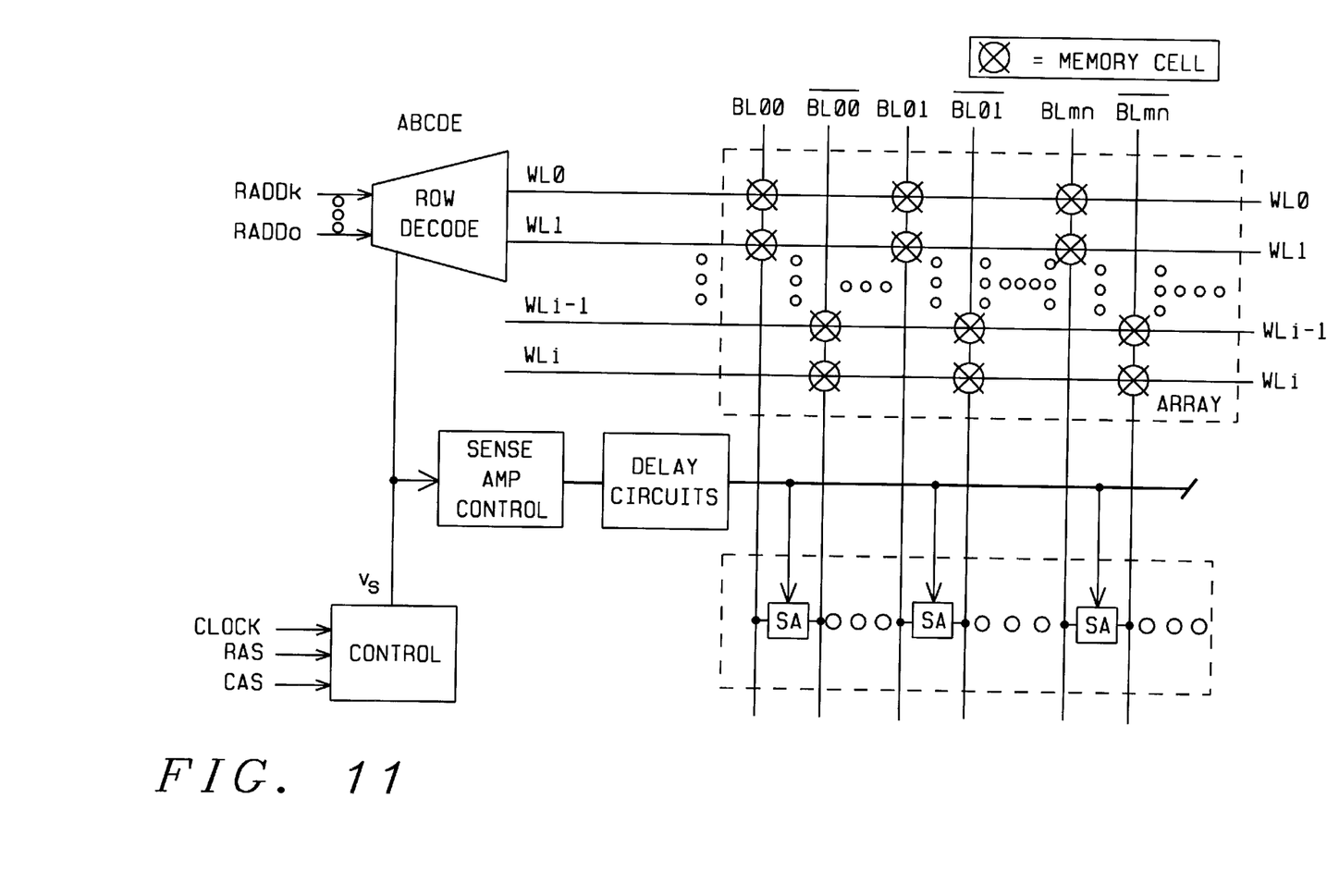
FIG. 11 is a schematic diagram of an integrated circuit DRAM illustrating a voltage independent delay circuit of this invention.

It is well known in the art, that the coincidence in timings of address selection and activation of the data sensing circuits within arrays of random access memories are critical to performance of random access memories such as DRAM and static random access memory (SRAM). FIG. 11 illustrates an integrated circuit containing a DRAM incorporating a delay circuit of this invention to minimize the delay variations in an access and activation path of the DRAM.

The DRAM circuit has an array of memory cells arranged in rows and columns. The structure of the memory cells is well known in the art. Each row of memory cells is connected to one word-line WL0–WLi and each column of memory cells is connected to the bit-lines BL0–BLm.

The word-lines WL0–WLi are connected to the row decoder. A word-line WL0–WLi is energized to select a row of memory cells to be activated. The bit-lines lines BL0–BLm are connected to sense amplifiers to sense the change in voltage that occurs when a charge from an activated memory cell flows to a bit-line BL0–BLm.

The row addresses RADD0–RADDK are decoded in the row decoder to choose which of the word-lines WL0–WLi is to be activated. The sense amplifier control circuitry provides the activation signals to turn on the sense amplifiers to detect the data stored in the selected memory cells. The timing and control circuits receive the row address strobe (RAS) and the column address strobe (CAS), and generates a select activation signal $V_S$. The control and timing circuit is connected to the row decoder and the sense amplifier control circuit to transfer the select activation signal $V_S$. The select activation signal $V_S$ stimulates the activation of the word-lines WL0–WLi and the sense amplifiers. However, to ensure error-free detection of the data from the selected memory cells, the sense amplifiers must be activated at the appropriate time after the activation of the word-lines WL0–WLi. A delay circuit is placed between the sense amplifier control and the sense amplifiers to equalize the delays and ensure proper sensing of the data. The propagation delay from the activation of the selected word-line WL0–WLi to the arrival of the charge from the memory cell to the sense amplifier is basically independent of the amplitude of the select activation signal $V_S$. However, the propagation delay of the sense amplifier control circuit and the delay circuits would be sensitive to the amplitude of the select activation signal $V_S$ if employing delay circuits of the prior art. The delay circuit employed in the DRAM of FIG. 11 is as shown in FIG. 7 and alternatively in FIG. 8. The activation of the sense amplifiers must be timed to be delayed to ensure correct sensing of the data. However, the deactivation of the sense amplifiers must occur promptly at the deselecting transition of the select activation signal $V_S$. The delay circuits of FIGS. 7 or 8 provide this feature.

While this invention has been particularly shown and described with reference to the preferred embodiments thereof, it will be understood by those skilled in the art that various changes in form and details may be made without departing from the spirit and scope of the invention.

The invention claimed is:

1. A voltage independent delay circuit comprising:
  a first inverter circuit having an input terminal and an output terminal where a first output signal at said output terminal is an inverse of an input signal at said input terminal;
  a voltage clamping circuit connected between the output terminal and the input terminal of the first inverter circuit to fix a voltage swing of input signal to a first voltage level;
  a delay capacitor connected to the output terminal of the first inverter to establish a transition time of the first output signal; and
  a second inverter having an input terminal connected to the output terminal of the first inverter circuit and an output terminal, whereby a second output signal at said output terminal is delayed from said input signal and said delay is independent of a final voltage level of said input signal.

2. The voltage independent delay circuit of claim 1 wherein the voltage clamping circuit comprises:
  a first MOS transistor of a first conductivity type having a gate and drain connected together to form a first diode connection and to the input terminal of the first inverter;
  a second MOS transistor of the first conductivity type having a gate and drain connected together to form a second diode connection which is connected to a source of the first MOS transistor of the first conductivity type; and
  a third MOS transistor of the first conductivity type having a drain connected to a source of the second MOS transistor of the first conductivity type, a gate connected to the output terminal of the first inverter, and a source connected to a reference voltage terminal.

3. The voltage independent delay circuit of claim 2 wherein the voltage clamping circuit further comprises:
  a first MOS transistor of a second conductivity type having a gate and drain connected together to form a third diode connection that is connected to the connection of the source of the second MOS transistor of the first conductivity type and the drain of the third MOS transistor of the first conductivity type, and a source connected to the input terminal of the first inverter.

4. The voltage independent delay circuit of claim 2 wherein the voltage clamping circuit further comprises:
  a second MOS transistor of a second conductivity type having a gate and drain connected together to form a fourth diode connection and to the input terminal of the first inverter;
  a third MOS transistor of the second conductivity type having a gate and drain connected together to form a fifth diode connection which is connected to a source of the second MOS transistor of the second conductivity type; and
  a fourth MOS transistor of the second conductivity type having a drain connected to a source of the third MOS transistor of the second conductivity type, a gate connected to the output terminal of the first inverter, and a source connected to a power supply voltage terminal.

5. The voltage independent delay circuit of claim 4 further comprising:

a fourth MOS transistor of the first conductivity type having a gate and drain connected together to form a sixth diode connection that is connected to the connection of the source of the third MOS transistor of the second conductivity type and the drain of the fourth MOS transistor of the second conductivity type, and a source connected to the input terminal of the first inverter.

6. The voltage independent delay circuit of claim 1 wherein the voltage clamping circuit comprises:

a fifth MOS transistor of a second conductivity type having a gate and drain connected together to form a seventh diode connection, and a source connected to the input terminal of the first inverter;

a sixth MOS transistor of the second conductivity type having a gate and drain connected together to form an eighth diode connection, and a source is connected to the seventh diode connection;

a fifth MOS transistor of a first conductivity type having a drain connected to the eighth diode connection, a gate connected to the output terminal of the first inverter, and a source connected to a reference voltage terminal.

7. The voltage independent delay circuit of claim 6 wherein the voltage clamping circuit further comprises:

a sixth MOS transistor of the first conductivity type having a gate and drain connected together to form a ninth diode connection, and a source connected to the input terminal of the first inverter;

a seventh MOS transistor of the first conductivity type having a gate and drain connected together to form a tenth diode connection, and a source connected to the ninth diode connection;

a seventh MOS transistor of the second conductivity type having a drain connected to the tenth diode connection, a gate connected to the output terminal of the first inverter, and a source connected to a power supply voltage terminal.

8. A voltage independent delay circuit to delay a first transition of a primary input signal while not delaying a second transition of the primary input signal comprising:

a first inverter circuit having an input terminal and an output terminal where a first output signal at said output terminal is an inverse of a first input signal at said input terminal;

a voltage clamping circuit connected between the output terminal and the input terminal of the first inverter circuit to fix a voltage swing of the first input signal to a first voltage level;

a delay capacitor connected to the output terminal of the first inverter to establish a transition time of the first output signal; and a logic gate having a first input terminal connected to the output terminal of the first inverter circuit and an output terminal having a primary output signal at said output terminal that is delayed from said input signal and said delay being independent of a final voltage level of said first input signal;

a second inverter having an input connected to receive the primary input signal and an output terminal connected to a second input terminal of the logic gate, such that the second transition of the primary input signal causes the primary output signal to transition with minimum delay; and a third inverter having an input terminal connected to the output terminal of the second inverter and an output terminal connected to the input terminal of the first inverter to transfer the first input signal to the first inverter.

9. The voltage independent delay circuit of claim 8 wherein the voltage clamping circuit comprises:

a first MOS transistor of a first conductivity type having a gate and drain connected together to form a first diode connection and to the input terminal of the first inverter;

a second MOS transistor of the first conductivity type having a gate and drain connected together to form a second diode connection which is connected to a source of the first MOS transistor of the first conductivity type; and a third MOS transistor of the first conductivity type having a drain connected to a source of the second MOS transistor of the first conductivity type, a gate connected to the output terminal of the first inverter, and a source connected to a reference voltage terminal.

10. The voltage independent delay circuit of claim 9 wherein the voltage clamping circuit further comprises:

a first MOS transistor of a second conductivity type having a gate and drain connected together to form a third diode connection that is connected to the connection of the source of the second MOS transistor of the first conductivity type and the drain of the third MOS transistor of the first conductivity type, and a source connected to the input terminal of the first inverter.

11. The voltage independent delay circuit of claim 9 wherein the voltage clamping circuit further comprises:

a second MOS transistor of a second conductivity type having a gate and drain connected together to form a fourth diode connection and to the input terminal of the first inverter;

a third MOS transistor of the second conductivity type having a gate and drain connected together to form a fifth diode connection which is connected to a source of the second MOS transistor of the second conductivity type; and a fourth MOS transistor of the second conductivity type having a drain connected to a source of the third MOS transistor of the second conductivity type, a gate connected to the output terminal of the first inverter, and a source connected to a power supply voltage terminal.

12. The voltage independent delay circuit of claim 11 wherein the voltage clamping circuit further comprises:

a fourth MOS transistor of the first conductivity type having a gate and drain connected together to form a sixth diode connection that is connected to the connection of the source of the third MOS transistor of the second conductivity type and the drain of the fourth MOS transistor of the second conductivity type, and a source connected to the input terminal of the first inverter.

13. The voltage independent delay circuit of claim 8 wherein the voltage clamping circuit comprises:

a fifth MOS transistor of a second conductivity type having a gate and drain connected together to form a seventh diode connection, and a source connected to the input terminal of the first inverter;

a sixth MOS transistor of the second conductivity type having a gate and drain connected together to form an eighth diode connection, and a source is connected to the seventh diode connection;

a fifth MOS transistor of a first conductivity type having a drain connected to the eighth diode connection, a gate connected to the output terminal of the first inverter, and a source connected to a reference voltage terminal.

14. The voltage independent delay circuit of claim 13 wherein the voltage clamping circuit further comprises:

a sixth MOS transistor of the first conductivity type having a gate and drain connected together to form a ninth diode connection, and a source connected to the input terminal of the first inverter;

a seventh MOS transistor of the first conductivity type having a gate and drain connected together to form a tenth diode connection, and a source connected to the ninth diode connection;

a seventh MOS transistor of the second conductivity type having a drain connected to the tenth diode connection, a gate connected to the output terminal of the first inverter, and a source connected to a power supply voltage terminal.

15. An integrated circuit comprising:

a first circuit placed within the integrated circuit;

a second circuit connected to said first circuit by a first signal path having a first delay time that is independent of a voltage level of a first signal transferred on said first signal delay path;

a third circuit connected to said first circuit by a second signal path having a second delay time that is dependent on the voltage level of a second signal transferred on said second signal delay path, whereby said first delay time is not equal to said second delay time;

a voltage independent delay circuit connected within said second signal path to delay said second signal such that it coincides with said first signal whereby said voltage independent delay circuit comprises:

a first inverter circuit having an input terminal and an output terminal where a first output signal at said output terminal is an inverse of an input signal at said input terminal;

a voltage clamping circuit connected between the output terminal and the input terminal of the first inverter circuit to fix a voltage swing of input signal to a first voltage level;

a delay capacitor connected to the output terminal of the first inverter to establish a transition time of the first output signal; and a second inverter having an input terminal connected to the output terminal of the first inverter circuit and an output terminal, whereby a second output signal at said output terminal is delayed from said input signal and said delay is independent of a final voltage level of said input signal.

16. The integrated circuit of claim 15 wherein said integrated circuit is a semiconductor memory, said second circuit is a word-line decoder connected to a plurality of word-lines to activate an array of memory cells and transfer data to one of a plurality of bit-lines, the third circuit is a sense amplifier control circuit, and the first circuit is a plurality of sense amplifiers, whereby said first delay time is the time required to activate said word-line and transfer data to one of said bit-lines to one of said sense amplifiers, and the second delay time is the time required to select and activate one of said sense amplifiers.

17. The integrated circuit of claim 16 wherein the semiconductor memory is chosen from a group of semiconductor memories consisting of dynamic random access memory and static random access memory.

18. The integrated circuit of claim 15 wherein the voltage clamping circuit of the voltage independent delay circuit comprises:

a first MOS transistor of a first conductivity type having a gate and drain connected together to form a first diode connection and to the input terminal of the first inverter;

a second MOS transistor of the first conductivity type having a gate and drain connected together to form a second diode connection which is connected to a source of the first MOS transistor of the first conductivity type; and a third MOS transistor of the first conductivity type having a drain connected to a source of the second MOS transistor of the first conductivity type, a gate connected to the output terminal of the first inverter, and a source connected to a reference voltage terminal.

19. The integrated circuit of claim 18 wherein the voltage clamping circuit of the voltage independent delay circuit further comprises:

a first MOS transistor of a second conductivity type having a gate and drain connected together to form a third diode connection that is connected to the connection of the source of the second MOS transistor of the first conductivity type and the drain of the third MOS transistor of the first conductivity type, and a source connected to the input terminal of the first inverter.

20. The integrated circuit of claim 18 wherein the voltage clamping circuit of the voltage independent delay circuit further comprises:

a second MOS transistor of a second conductivity type having a gate and drain connected together to form a fourth diode connection and to the input terminal of the first inverter;

a third MOS transistor of the second conductivity type having a gate and drain connected together to form a fifth diode connection which is connected to a source of the second MOS transistor of the second conductivity type; and a fourth MOS transistor of the second conductivity type having a drain connected to a source of the third MOS transistor of the second conductivity type, a gate connected to the output terminal of the first inverter, and a source connected to a power supply voltage terminal.

21. The integrated circuit of claim 20 wherein the voltage clamping circuit of the voltage independent delay circuit further comprises:

a fourth MOS transistor of the first conductivity type having a gate and drain connected together to form a sixth diode connection that is connected to the connection of the source of the third MOS transistor of the second conductivity type and the drain of the fourth MOS transistor of the second conductivity type, and a source connected to the input terminal of the first inverter.

22. The integrated circuit of claim 15 wherein the voltage clamping circuit of the voltage independent delay circuit comprises:

a fifth MOS transistor of a second conductivity type having a gate and drain connected together to form a seventh diode connection, and a source connected to the input terminal of the first inverter;

a sixth MOS transistor of the second conductivity type having a gate and drain connected together to form an eighth diode connection, and a source is connected to the seventh diode connection;

a fifth MOS transistor of the first conductivity type having a drain connected to the eighth diode connection, a gate connected to the output terminal of the first inverter, and a source connected to a reference voltage terminal.

23. The integrated circuit of claim 22 wherein the voltage clamping circuit of the voltage independent delay circuit further comprises:

a sixth MOS transistor of the first conductivity type having a gate and drain connected together to form a ninth diode connection, and a source connected to the input terminal of the first inverter;

a seventh MOS transistor of the first conductivity type having a gate and drain connected together to form a tenth diode connection, and a source connected to the ninth diode connection;

a seventh MOS transistor of the second conductivity type having a drain connected to the tenth diode connection, a gate connected to the output terminal of the first inverter, and a source connected to a power supply voltage terminal.

24. The integrated circuit of claim 23 wherein the voltage clamping circuit of the voltage independent delay circuit comprises:

a first MOS transistor of a first conductivity type having a gate and drain connected together to form a first diode connection and to the input terminal of the first inverter;

a second MOS transistor of the first conductivity type having a gate and drain connected together to form a second diode connection which is connected to a source of the first MOS transistor of the first conductivity type; and a third MOS transistor of the first conductivity type having a drain connected to a source of the second MOS transistor of the first conductivity type, a gate connected to the output terminal of the first inverter, and a source connected to a reference voltage terminal.

25. The integrated circuit of claim 24 wherein the voltage clamping circuit of the voltage independent delay circuit further comprises:

a first MOS transistor of a second conductivity type having a gate and drain connected together to form a third diode connection that is connected to the connection of the source of the second MOS transistor of the first conductivity type and the drain of the third MOS transistor of the first conductivity type, and a source connected to the input terminal of the first inverter.

26. The integrated circuit of claim 24 wherein the voltage clamping circuit of the voltage independent delay circuit comprises:

a second MOS transistor of a second conductivity type having a gate and drain connected together to form a fourth diode connection and to the input terminal of the first inverter;

a third MOS transistor of the second conductivity type having a gate and drain connected together to form a fifth diode connection which is connected to a source of the second MOS transistor of the second conductivity type; and a fourth MOS transistor of the second conductivity type having a drain connected to a source of the third MOS transistor of the second conductivity type, a gate connected to the output terminal of the first inverter, and a source connected to a power supply voltage terminal.

27. The integrated circuit of claim 26 wherein the voltage clamping circuit of the voltage independent delay circuit further comprises:

a fourth MOS transistor of the first conductivity type having a gate and drain connected together to form a sixth diode connection that is connected to the connection of the source of the third MOS transistor of the second conductivity type and the drain of the fourth MOS transistor of the second conductivity type, and a source connected to the input terminal of the first inverter.

28. The integrated circuit of claim 23 wherein the voltage clamping circuit of the voltage independent delay circuit comprises:

a sixth MOS transistor of the first conductivity type having a gate and drain connected together to form a ninth diode connection, and a source connected to the input terminal of the first inverter;

a seventh MOS transistor of the first conductivity type having a gate and drain connected together to form a tenth diode connection, and a source connected to the ninth diode connection;

a seventh MOS transistor of the second conductivity type having a drain connected to the tenth diode connection, a gate connected to the output terminal of the first inverter, and a source connected to a power supply voltage terminal.

29. An integrated circuit comprising:

a first circuit placed within the integrated circuit;

a second circuit connected to said first circuit by a first signal path having a first delay time that is independent of a voltage level of a first signal transferred on said first signal delay path;

a third circuit connected to said first circuit by a second signal path having a second delay time that is dependent on the voltage level of a second signal transferred on said second signal delay path, whereby said first delay time is not equal to said second delay time;

a voltage independent delay circuit connected within said delay path to delay said second signal such that it coincides with said first signal whereby said voltage independent delay circuit comprises:

a first inverter circuit having an input terminal and an output terminal where a first output signal at said output terminal is an inverse of a first input signal at said input terminal;

a voltage clamping circuit connected between the output terminal and the input terminal of the first inverter circuit to fix a voltage swing of the first input signal to a first voltage level;

a delay capacitor connected to the output terminal of the first inverter to establish a transition time of the first output signal; and a logic gate having a first input terminal connected to the output terminal of the first inverter circuit and an output terminal, having a primary output signal at said output terminal that is delayed from said input signal and said delay being independent of a final voltage level of said first input signal;

a second inverter having an input connected to receive the primary input signal and an output terminal connected to a second input terminal of the logic gate, whereby the second transition of the primary input signal causes the output signal to transition with minimum delay; and a third inverter having an input terminal connected to the output terminal of the second inverter and an output terminal connected to the input terminal of the first inverter to transfer the first input signal to the first inverter.

30. The integrated circuit of claim 29 wherein said integrated circuit is a DRAM, said second circuit is a word-line decoder connected to a plurality of word-lines to activate an array of memory cells and transfer data to one of a plurality of bit-lines, the third circuit is a sense amplifier control circuit, and the first circuit is a plurality of sense amplifiers, whereby said first delay time is the time required to activate said word-line and transfer data to one of said bit-lines to one of said sense amplifiers, and the second delay time is the time required to select and activate one of said sense amplifiers.

31. The integrated circuit of claim 29 wherein the voltage clamping circuit of the voltage independent delay circuit comprises:

a fifthe MOS transistor of a second conductivity type having a gate and drain connected together to form a seventh diode connection, and a source connected to the input terminal of the first inverter;

a sixth MOS trasistor of the second conductivity type having a gate and drain connected together to the form an eighth diode connection, and a source is connected to the seventh diode connection, a fifth MOS transistor of a first conductivity type having a drain connected to the eighth diode connection, a gate connected to the output terminal of the first inverter, and a source connected to a reference voltage terminal.

* * * * *